United States Patent
Nozaki

(10) Patent No.: US 7,154,137 B2
(45) Date of Patent: Dec. 26, 2006

(54) IMAGE SENSOR AND PIXEL HAVING A NON-CONVEX PHOTODIODE

(75) Inventor: Hidetoshi Nozaki, Santa Clara, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/963,980

(22) Filed: Oct. 12, 2004

(65) Prior Publication Data

US 2006/0076588 A1    Apr. 13, 2006

(51) Int. Cl.
H01L 27/148    (2006.01)
H01L 29/768    (2006.01)

(52) U.S. Cl. ...................... 257/292; 257/233
(58) Field of Classification Search ................ 257/292, 257/233
See application file for complete search history.

(56) References Cited

U.S. PATENT DOCUMENTS

| | | | | |
|---|---|---|---|---|
| 4,070,205 A | * | 1/1978 | Rahilly | 136/255 |
| 5,061,977 A | * | 10/1991 | Funaba | 257/464 |
| 6,147,372 A | * | 11/2000 | Yang et al. | 257/232 |
| 6,309,905 B1 | | 10/2001 | Yaung et al. | |
| 6,329,679 B1 | | 12/2001 | Park | |
| 6,489,643 B1 | * | 12/2002 | Lee et al. | 257/292 |
| 6,531,752 B1 | * | 3/2003 | Yaung et al. | 257/465 |

FOREIGN PATENT DOCUMENTS

JP    2000031451    1/2000

OTHER PUBLICATIONS

European Search Report for European Application No. EP 05 25 6333, completed on Jan. 19, 2006, 3 pages.

* cited by examiner

*Primary Examiner*—Andy Huynh
*Assistant Examiner*—Earl Taylor
(74) *Attorney, Agent, or Firm*—Perkins Coie LLP

(57) ABSTRACT

In a photodiode used in a pixel of an image sensor, the area of interface between an N-type region and a P-type region is increased, such as through the use of an interstitial P+-type region or an interstitial P-type region. By increasing the interface area, greater well capacity can be attained. Further, this also enhances depletion of the photodiode. By changing the shape of the N-type layer, an increase in the area of the interface between the P-type region and N-type layer can be attained. While the types of shapes used for the N-type layer are many, the present invention is directed towards a photodiode with an increased interface area between the P-type and N-type regions.

17 Claims, 6 Drawing Sheets

US 7,154,137 B2

IMAGE SENSOR AND PIXEL HAVING A NON-CONVEX PHOTODIODE

TECHNICAL FIELD

The present invention relates to image sensors, and more particularly, to an image sensor that uses pixels having enhanced photodiode well capacity and depletion.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

As the pixels become smaller, the surface area that can receive incident light is also reduced. The pixel typically has a light-sensing element, such as a photodiode, which receives incident light and produces a signal in relation to the amount of incident light. Thus, as the pixel area (and thus the photodiode area) decreases, the pixel has a lower sensitivity and lower signal saturation level.

The above mentioned low saturation level is primarily a result of the low well capacity of a small photodiode. One prior art solution for this problem is to increase the impurity concentrations of the layers comprising the photodiode. For example, the commonly used pinned photodiode has a structure that is an N-type layer surrounded by a P or P+ region. However, increasing the impurity concentration of the N-type layer tends to cause an increase of image lag.

The present invention is directed towards a photodiode and pixel design that has high well capacity and with limited image lag.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
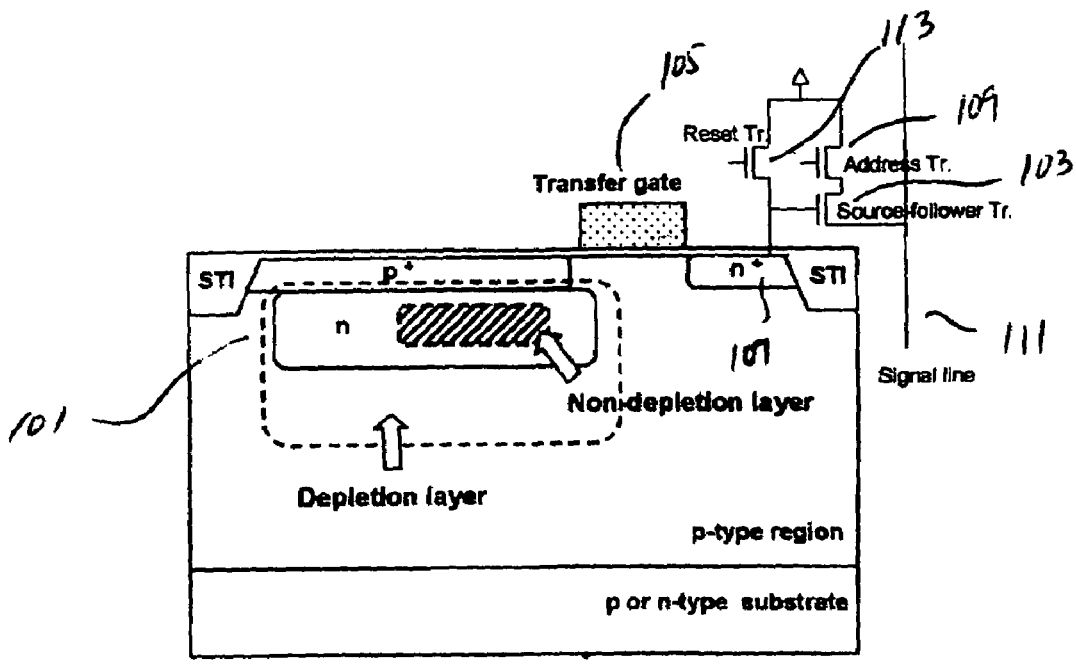
FIG. 1 is a combination cross-sectional and schematic diagram of a prior art four transistor (4T) pixel which shows in detail a photodiode formed in a substrate.

FIG. 1 shows a combination cross-sectional and schematic view of a prior art active pixel that uses four transistors. This is known in the art as a 4T active pixel. A light-sensing element, in this embodiment a photodiode 101, outputs a signal that is used to modulate an amplification transistor 103. The amplification transistor 103 is also referred to as a source follower transistor. While the light-sensing element can be one of a variety of devices, including without limitation, photogates, photodiodes, pinned photodiodes, partially pinned photodiodes, etc., in the present invention, the light-sensing element is a photodiode (whether of the pinned, partially pinned, or unpinned variety). A transfer transistor 105 is used to transfer the signal output by the photodiode 101 to a floating node 107, which is connected to the gate of the amplification transistor 105. The transfer transistor 105 is controlled by a transfer gate.

In operation, during an integration period (also referred to as an exposure or accumulation period), the photodiode 101 generates charge that is held in the N-type layer. After the integration period, the transfer transistor 105 is turned on to transfer the charge held in the N-type layer of the photodiode 101 to the floating node 107. After the signal has been transferred to the floating node 107, the transfer transistor 105 is turned off again for the start of a subsequent integration period.

The signal on the floating node 107 is then used to modulate the amplification transistor 103. Finally, an address transistor 109 is used as a means to address the pixel and to selectively read out the signal onto a column bit line 111. After readout through the column bit line 111, a reset transistor 113 resets the floating node 107 to a reference voltage. In one embodiment, the reference voltage is $V_{dd}$.

As noted above, electrons are accumulated in the N-type layer during the integration period. After the integration period, the electrons (signal) are transferred from the N-type layer into the floating node 107 by applying a high voltage pulse to the transfer gate of the transfer transistor 105. However, complete depletion of the N-type layer is difficult because the voltage provided onto the gate of the transfer transistor 105 is normally less than 3.3 volts. Therefore, a non-depletion layer with high electron concentration, typically more than 1 e16 $cm^{-3}$, tends to remain in the N-type layer. This non-depletion layer gives rise to image lag in a typical CMOS image sensor application. In addition, the prior art structure of FIG. 1 typically requires a relatively high impurity concentration for the n-layer to achieve high well capacity, resulting in further increase of image lag.

Note that the N-type layer of FIG. 1 has a convex shape. Indeed, prior art photodiodes are formed with an N-type layer with a substantially convex shape, e.g. a convex polygon or a convex semicircle or a convex ellipsoid. In contrast, as will be seen in greater detail below, according to one aspect of the present invention, the N-type layer is formed with at least one concavity.

Figure 2:
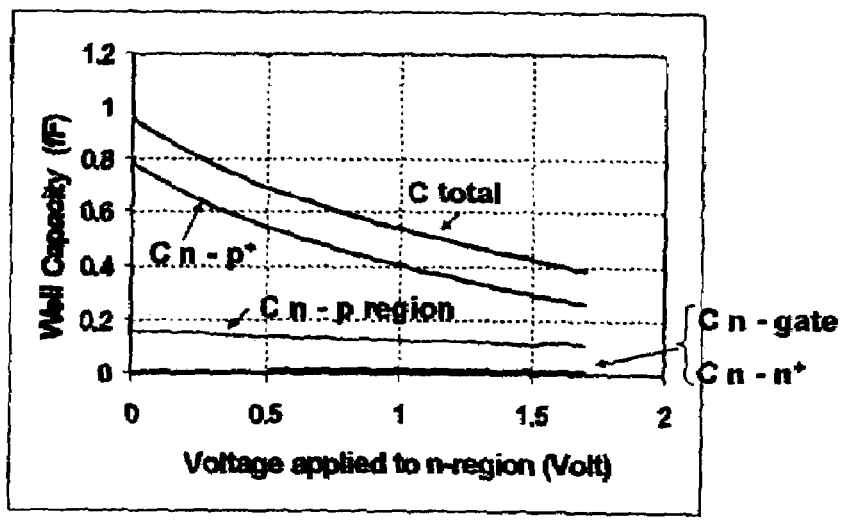
FIG. 2 is a graph showing the well capacity of the photodiode of FIG. 1 relative to the applied voltage to the transfer gate.

FIG. 2 is a graph that shows the well capacity (in femtofarads) relative to the applied voltage to the transfer gate. Note also that FIG. 2 shows the total capacitance of the photodiode broken down into various components: (1) the capacitance between the N-type layer and the P+ pinning layer, (2) the capacitance between the N-type layer and the P-type region (which could be an epi layer or the semiconductor substrate), and (3) the capacitance between the N-type layer to the floating node and the N-type layer to the transfer gate. As seen in FIG. 2, the capacity at the P+/N junction is the largest component of the total well capacity. The second largest component of the total well capacity is between the N-type layer and the P-type region. The third capacitive component is negligibly small. Thus, it can be seen that the interface between the P+ pinning layer and the N-type layer is the largest component. Further, the P+/N interface junction also an effect on enhancing depletion of the N-type layer.

Figure 3:
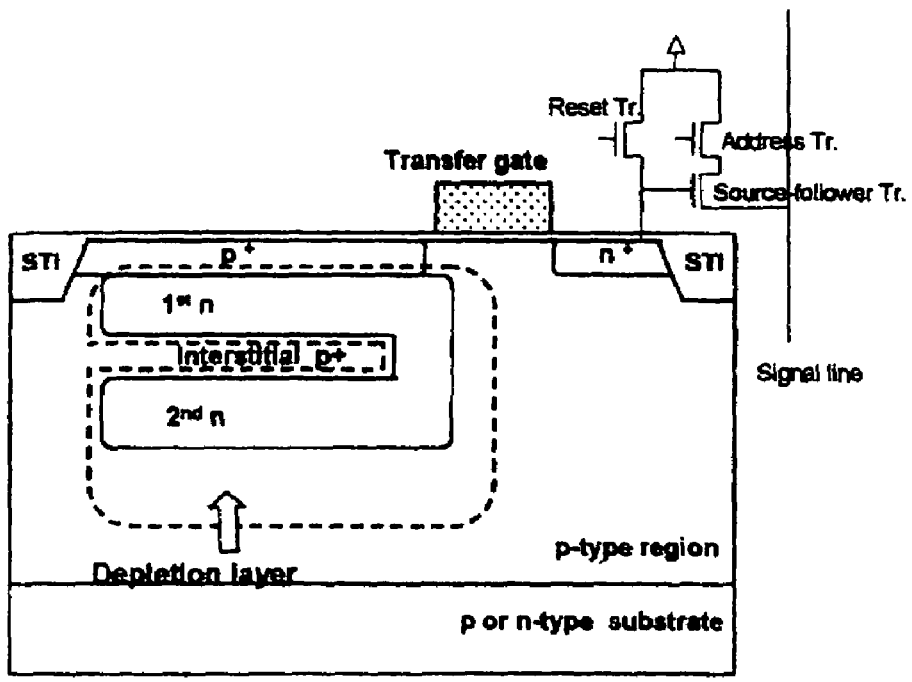
FIG. 3 is a combination cross-sectional and schematic diagram of a photodiode and pixel formed in accordance with the present invention.

In accordance with the present invention, FIG. 3 shows a new design for a photodiode that has an interstitial P+ layer "within" the N-type layer (also known as an N-type region). Therefore, the N-type layer has a comb-shape. This is also referred to as a horizontal finger shape. Moreover, while the fingers extend in the horizontal direction, the present invention may also be applied to have a N-type layer shape that has fingers that run in the vertical direction. However, current manufacturing methods make it difficult to form such narrow P+ interstitial regions in the vertical dimension. Still, as process technology improves, the present invention contemplates vertical interstitial P+ regions.

Figure 4:
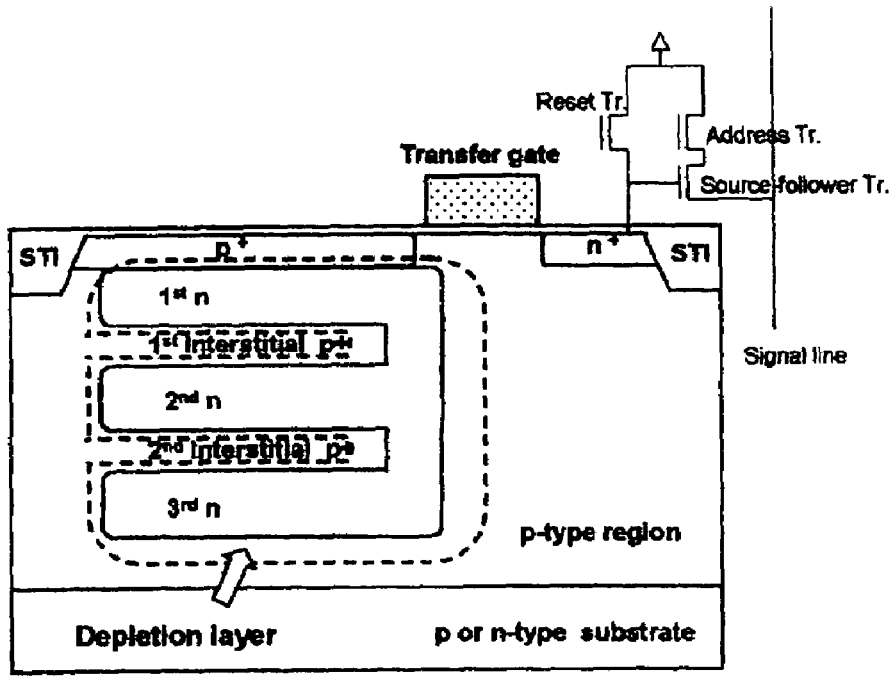
FIG. 4 is a combination cross-sectional and schematic diagram of an alternative embodiment of a photodiode and pixel formed in accordance with the present invention.

While FIG. 3 shows a two-finger N-type layer shape, FIG. 4 shows an alternative embodiment which shows three fingers and two interstitial P+ regions. It can be appreciated that the present invention can be extended to any number of interstitial P+ regions and fingers. The limitation is in the manufacturing processes needed to form such shaped structures.

The conventional prior art structure shown in FIG. 1 has only a single P+/N interface, as well as a relatively low amount of area where the N-type layer interfaces with a P-type region or P+ pinning layer. In accordance with the present invention, photodiodes are formed with an N-type layer that has increased interface area between the N-type layer and the surrounding P-type or P+ regions. The additional interface area between the N-type layer and the P-type region and P+ regions are capable of increasing the well capacity of the photodiode and also enhancing the depletion of the N-type layer.

The photodiode formed in accordance with the present invention is characterized by an N-type layer formed within a P-type region or substrate. In one embodiment, the N-type layer has interstitial P+ regions adjacent to the N-type layer that increase the well capacity. Specifically, as seen in FIG. 3, the n-type layer has two horizontal fingers that surround a single interstitial P+ region. FIG. 4 shows two interstitial P+ regions that are between three horizontal fingers of the N-type layer. It can be appreciated that various different shapes of N-type layers and placement of interstitial P+ regions may be possible and that the Figures shown herein are merely exemplary. For example, as noted above, the fingers may be vertical. Alternatively, the N-type layer may be H-shaped, I-shaped, T-shaped or any other shape that allows for increased interface between interstitial P+ regions and the N-type layer. In the broadest sense, by making the N-type layer have at least one concavity, there is increased interface area between the N-type layer and the surrounding P-type regions.

Figure 5:
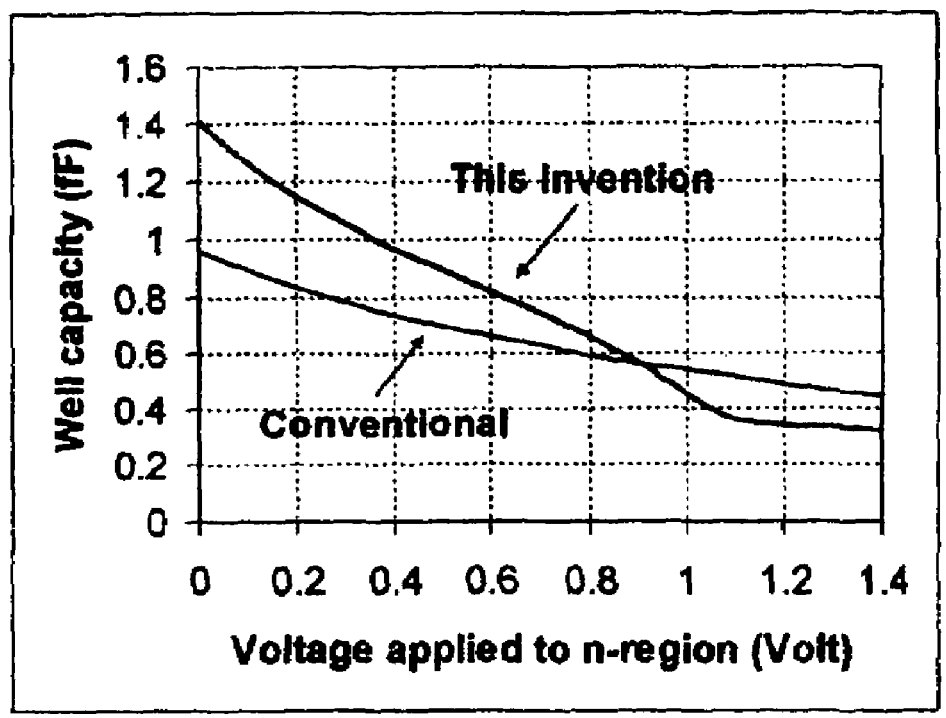
FIG. 5 is a graph showing the relative well capacity of a photodiode formed in accordance with the present invention compared to a prior art photodiode.

FIG. 5 shows the relationship between well capacity and n-region voltage for a structure formed in accordance with the present invention and that of the prior art photodiode of FIG. 1. In the low voltage region less than 0.9 volts, the well capacity of a photodiode formed in accordance with the present invention is much higher than that of the conventional prior art photodiode of FIG. 1. Note that the well capacity of the photodiode of the present invention decreases with the applied voltage and becomes lower than that of the prior art photodiode when the voltage in the n-region becomes greater than 0.9 volts. This rapid decrease in the well capacity demonstrates that the added P+/N interface area shown in FIGS. 3 and 4 enhance the depletion of the n-type layer.

The maximum number of accumulated electrons in the photodiode, which is proportional to the saturation signal level, is estimated as an integral of well capacity through the voltage range from 0 volts to a certain voltage determined just after turning off the voltage applied to the transfer gate of the transfer transistor 105. This certain voltage, that is the highest positive voltage applied to the n-type layer during accumulation, has a value ranging from 0.9 volts to 1.3 volts in most current-day CMOS image sensor applications that use pinned photodiodes. Thus, the structure of a photodiode formed in accordance with the present invention has the advantage of high saturation level, yet low image lag due to enhanced depletion.

Figure 6:
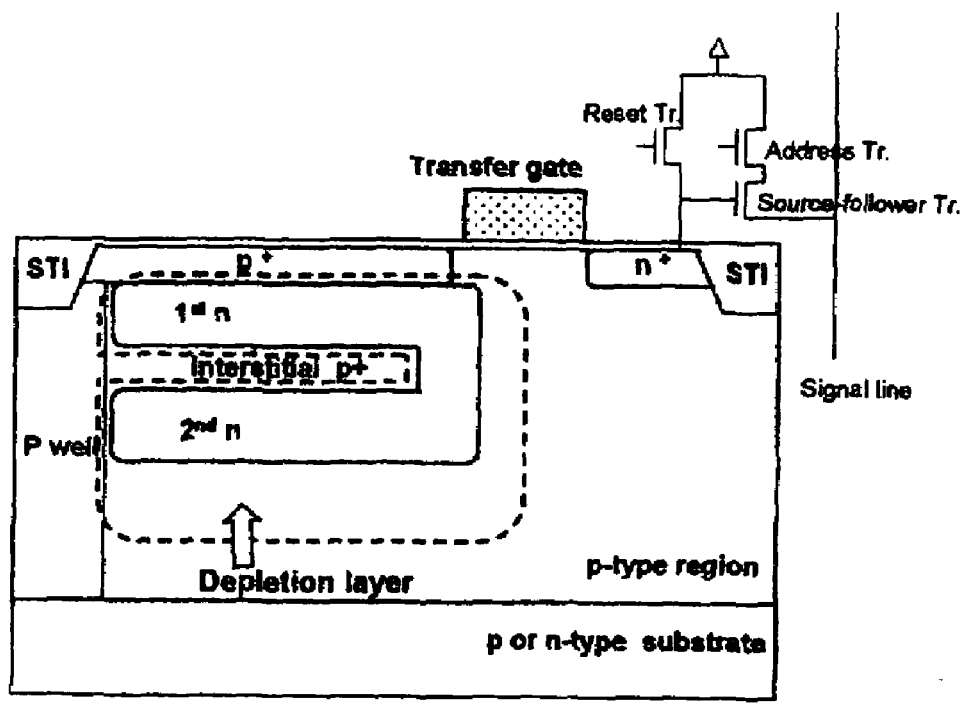
FIGS. 6–7 illustrate a manufacturing process for making the photodiode and pixel of the present invention.
Figure 7:
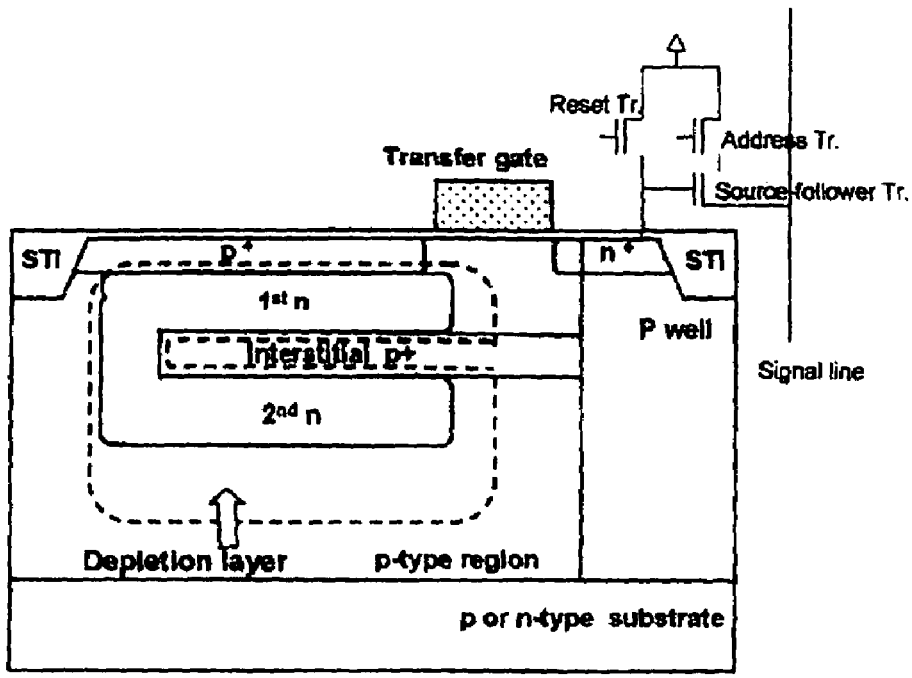

Turning to FIGS. 6–7, the two-finger n-type layer shown in FIGS. 6–7 can be formed by, for example, multiple N-type impurity implantations at different energies. Alternatively, a single N-type impurity implantation can be performed and the impurities diffused by a following thermal anneal. The interstitial P+ region can be formed by a P+ impurity implantation separately. Further, by adjusting the energy of the implantation, the depth and location of the interstitial P+ region can be precisely controlled using state-of-the-art implantation techniques.

Figure 8:
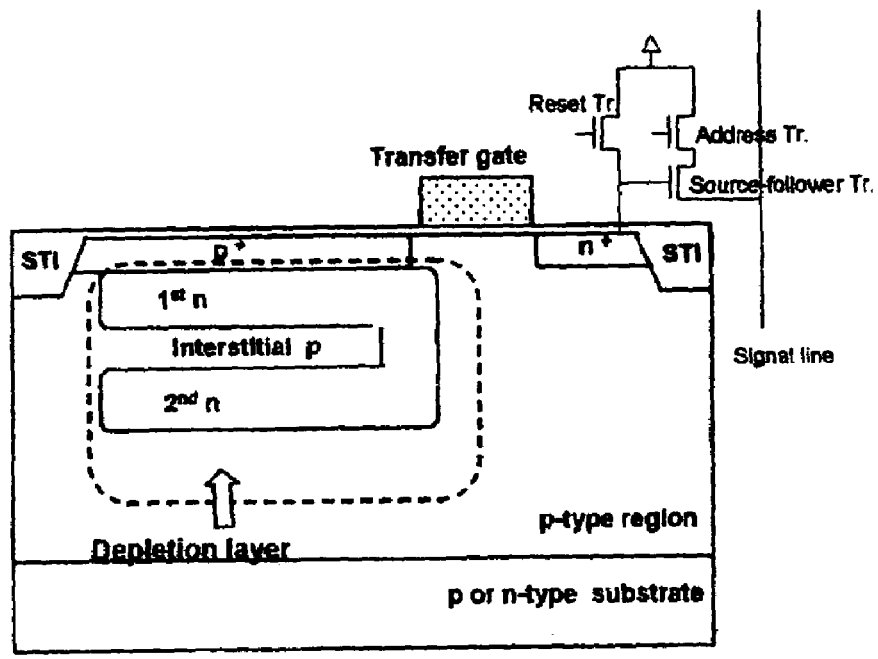
FIGS. 8–9 illustrate an alternative method for forming an alternative embodiment of the photodiode and pixel of the present invention.
Figure 9:
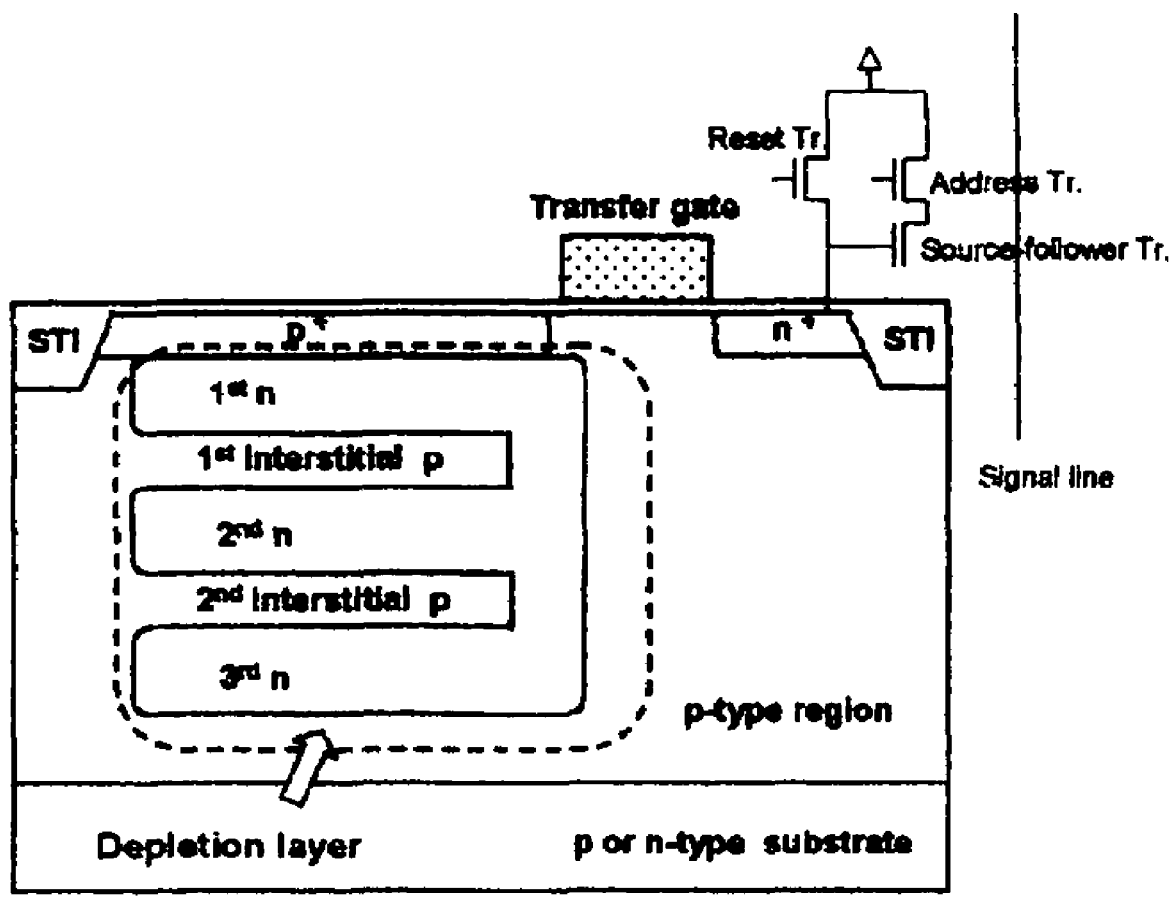

In another alternative embodiment, FIGS. 8 and 9 show a photodiode having horizontal fingers with interstitial P-type regions. These lower impurity P-type regions can have their impurity concentrations adjusted to achieve complete depletion just after turning off of the transfer gate. Thus, the P-type layers of FIGS. 8 and 9 have lower acceptor concentrations than the P+-type layers shown in FIGS. 6 and 7. While the maximum number of accumulated electrons, i.e., the well capacity, may be decreased relative to the P+-type interstitial regions, complete depletion is possible which results in nearly no image lag for the photodiode. Further, low dark current is possible in addition to nearly no image lag for the photodiode. This is because the electric field at the P+/N-type junction is lower than the case of FIGS. 3–4.

Figure 10:
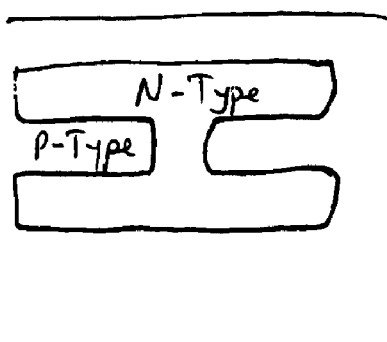
FIG. 10 illustrates examples of other shapes of N-type regions.
Figure 10:
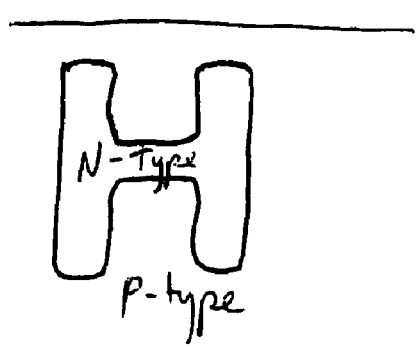
Figure 10:
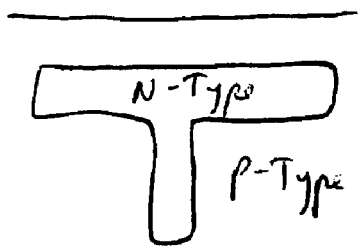
Figure 10:
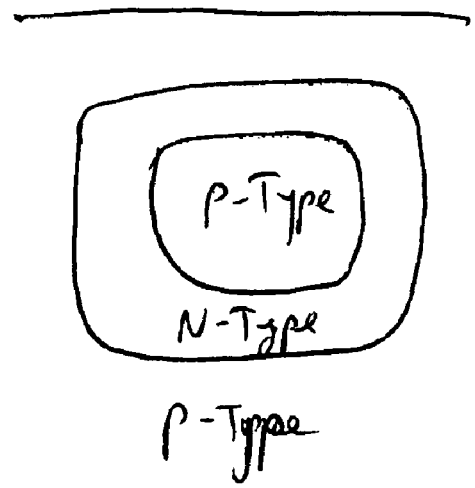

As seen in the detailed description above, the present invention relates to increasing the area of interface between the N-type region and either a P-type region or an interstitial P+-type region or an interstitial P-type region. By increasing the interface area, greater well capacity can be attained. Further, this also helps in transferring the signal accumulated in the N-type layer to the floating node 107. In the prior art, photodiodes were formed using shapes that were not optimized to increase the P-N interface area. Thus, in FIG. 1, the prior art photodiode had a rectangular shape. By changing the shape of the N-type layer, an increase in the area of the interface between the P-type region and N-type layer can be attained. While the types of shapes used for the N-type layer are many, the present invention is directed towards a photodiode with an increased interface area between the P-type and N-type regions. Examples of numerous other shapes of the N-type region can be seen in FIG. 10.

From the foregoing, it will be appreciated that specific embodiments of the invention have been described herein for purposes of illustration, but that various modifications may be made without deviating from the spirit and scope of the invention. For example, it may be possible to use the concepts of the present invention with un-pinned photodiodes. Accordingly, the invention is not limited except as by the appended claims.

I claim:

1. An active pixel comprising:
   a photodiode formed in a semiconductor substrate, said photodiode being an N-type region formed within a P-type region, said N-type region having at least two fingers with a P-type interstitial region between said fingers when viewed in a vertical cross sectional plane that is substantially perpendicular to a surface of the semiconductor substrate;
   a transfer transistor formed between said photodiode and a floating node and selectively operative to transfer a signal from said photodiode to said floating node, wherein said P-type interstitial region has an impurity concentration adjusted to achieve a complete depletion just after turning off said transfer transistor; and
   an amplification transistor controlled by said floating node.

2. The pixel of claim 1 wherein said photodiode has a P+ pinning layer on the surface of said semiconductor substrate and above said N-type region.

3. The pixel of claim 1 wherein said P-type interstitial region is a P+ interstitial region.

4. The pixel of claim 1 further including a reset transistor operative to reset said floating node to a reference voltage.

5. The pixel of claim 1 wherein said N-type layer has at least three fingers with at least two P-type interstitial regions separating said fingers.

6. The pixel of claim 5 wherein said P-type interstitial regions are P+ interstitial regions.

7. An imaging device comprising:
   a photodiode formed in a semiconductor substrate, said photodiode being an N-type region formed within a P-type region, said N-type region having at least two fingers with a P-type interstitial region between said fingers when viewed in a vertical cross sectional plane that is substantially perpendicular to a surface of the semiconductor substrate;
   a transfer transistor formed between said photodiode and a floating node and selectively operative to transfer a signal from said photodiode to said floating node, and wherein said P-type interstitial region has an impurity concentration adjusted to achieve a complete depletion just after turning off said transfer transistor; and
   an amplification transistor controlled by said floating node.

8. The imaging device of claim 7 wherein said photodiode has a P+ pinning layer on the surface of said semiconductor substrate and above said N-type region.

9. The imaging device of claim 7 wherein said P-type interstitial region is a P+ interstitial region.

10. The imaging device of claim 7 further including a reset transistor operative to reset said floating node to a reference voltage.

11. The imaging device of claim 7 wherein said N-type layer has at least three fingers with at least two P-type interstitial regions separating said fingers.

12. The imaging device of claim 11 wherein said P-type interstitial regions are P+ interstitial regions.

13. The imaging device of claim 7 wherein said N-type region is either I-shaded, H-shaped, T-shaped, or O-shaped.

14. An active pixel comprising:
    a photodiode formed in a semiconductor substrate, said photodiode being an N-type region formed within a P-type region, said N-type region having at least one concavity when viewed in a vertical cross sectional plane that is substantially perpendicular to a surface of said semiconductor substrate, wherein said N-type region is either I-shaped, H-shaped, T-shaped, or O-shaped; wherein said photodiode further includes an interstitial P-type region in said N-type region, and wherein said P-type interstitial region has an impurity concentration adjusted to achieve a complete depletion just after turning off said transfer;
    a transfer transistor formed between said photodiode and a floating node and selectively operative to transfer a signal from said photodiode to said floating node; and
    an amplification transistor controlled by said floating node.

15. The pixel of claim 14 wherein said photodiode further includes a P-type pinning layer above said N-type region.

16. The pixel of claim 14 further including a reset transistor operative to reset said floating node to a reference voltage.

17. The pixel of claim 14 wherein said P-type region includes a P+ region.

* * * * *